United States Patent [19]

Sugiki

[11] Patent Number: 4,680,637

[45] Date of Patent: Jul. 14, 1987

[54] CCD AREA SENSOR WITH LOW SIGNAL LEVEL VARIATION

[75] Inventor: Tadashi Sugiki, Yokohama, Japan

[73] Assignee: Kabushiki Kaisha Toshiba, Kawasaki, Japan

[21] Appl. No.: 814,376

[22] Filed: Dec. 30, 1985

[30] Foreign Application Priority Data

Jan. 14, 1985 [JP] Japan .................................. 60-4368

[51] Int. Cl.$^4$ ........................ H04N 5/21; H04N 3/15
[52] U.S. Cl. ........................... 358/213.26; 358/213.18; 358/221
[58] Field of Search ............... 358/213, 212, 221, 167

[56] References Cited

U.S. PATENT DOCUMENTS

| 4,245,252 | 1/1981 | Nagumo | 358/213 |
| 4,263,623 | 4/1981 | Woo et al. | 358/213 |
| 4,340,909 | 7/1982 | Yamada et al. | 358/213 |
| 4,360,833 | 11/1982 | Kinoshita et al. | 358/213 |
| 4,498,105 | 2/1985 | Crawshaw | 358/221 |
| 4,549,215 | 10/1985 | Levine | 358/213 |
| 4,562,475 | 12/1985 | Levine | 358/213 |

FOREIGN PATENT DOCUMENTS 3600253 4/1983 Fed. Rep. of Germany .
3412861 10/1984 Fed. Rep. of Germany .
56-119994 9/1981 Japan .

OTHER PUBLICATIONS

Communication from West German Patent Office with English Transl. Article from IEEE vol. ED-31, No. 7, Jul. 1984, pp. 904–906, entitled "A New Configuration of CCD Imager with a very low smear level-FIT-CCD Imager".

English Translation of Japanese Patent Disclosure #56-119994.

Primary Examiner—Gene Z. Rubinson
Assistant Examiner—Stephen Brinich
Attorney, Agent, or Firm—Cushman, Darby & Cushman

[57] ABSTRACT

The horizontal transfer register of a CCD image sensor has a final stage electrode which is independent of other electrodes of the horizontal transfer register. To eliminate flickering in a video picture, the operation of the horizontal transfer register is stopped for a given period of time during which field shifting is effected. The final stage electrode is driven by continuous pulses even when the operation of the horizontal transfer register is stopped during field shifting, thereby eliminating black level variations from an image sensor output.

12 Claims, 18 Drawing Figures

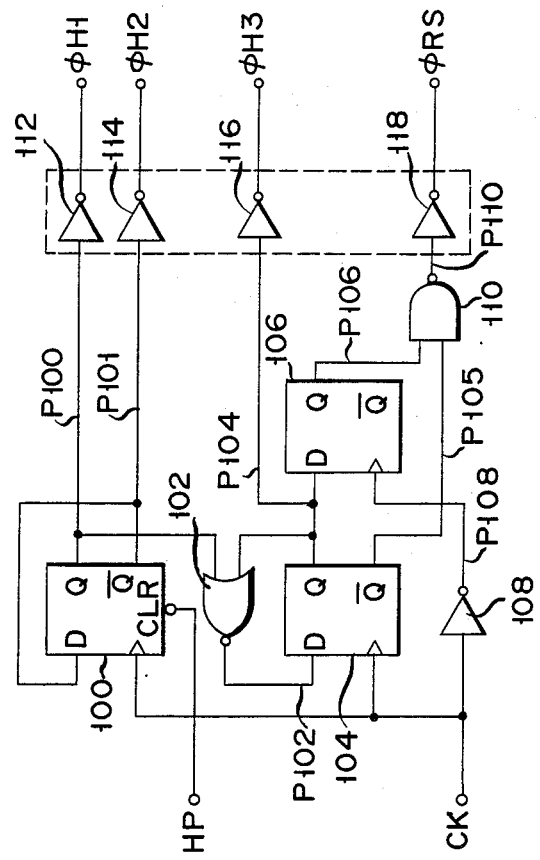
F I G. 5

CCD AREA SENSOR WITH LOW SIGNAL LEVEL VARIATION

BACKGROUND OF THE INVENTION

The present invention relates to a solid-state image sensor, and particularly to improvement of a two-dimensional CCD image sensor operating in a field storage mode.

Two-dimensional CCD image sensors operating in a field storage mode are conventionally used in TV cameras. In the field storage mode, signal charge transfers from photodiodes are carried out for each field to achieve interlaced scanning. The transfer of signal charges in the manner mentioned is referred to as field shifting. Field shift signal charges are sequentially sent from vertical transfer registers to charge coupling portions provided for a horizontal charge transfer. The sending of signal charges in this manner is referred to as line shifting. The line-shifted signal charges are converted, by the horizontal charge transferring operation, to an output signal of the image sensor.

FIG. 1 shows the typical arrangement of the CCD image sensor's electrodes. Line shifting requires overlapped portions X, provided between electrode 12 of the vertical transfer register and electrode 15 of the horizontal transfer register. This means that a certain coupling capacitance is formed between electrode 12 and 15 via overlapped portions X. As a result, when the horizontal transfer register is operated during field shifting, the potential at electrode 12 is unfavorably modulated by horizontal driving pulses applied to electrode 15.

Further, when interlaced scanning is performed, through the horizontal transfer frequency is equal to the even number multiple of the horizontal scanning frequency is not the even number multiple of the horizontal scanning frequency in an odd field. Consequently, since the phase difference between the field shifting pulse and the horizontal driving pulse obtained in the odd field differs from that obtained in the even field, potential variations are invited in the image sensor output, thereby causing flickering in the obtained image.

According to the inventor, such flickering can be eliminated by temporarily stopping the operation of the horizontal transfer register in a CCD image sensor when field shifting is performed. Though flickering can be effectively eliminated when the operation of the horizontal transfer register is temporarily stopped for each field shift, another serious problem arises. That is, the signal level of the image sensor output (black level of the video picture) obtained when the horizontal transfer register is operated differs from that obtained when the operation of the horizontal transfer register is temporarily stopped. This is a serious problem, particularly when the sensitivity of a TV camera using the above CCD image sensor is high.

Further, if the horizontal transfer register carries out the charge transferring operation when line shifting is performed, the sharpness or resolution of the obtained image along the horizontal direction deteriorates, because charges sent from the vertical transfer register are unfavorably spread over several stages of the horizontal transfer register. To prevent such an unfavorable charge spread, the operation of the horizontal transfer register has to be stopped when line shifting is performed. Just as above, however, stoppage of the horizontal transfer register invariably gives rise to the problem of signal level differences.

Summary of the Invention

It is, accordingly, an object of the present invention to provide a solid-state image sensor whose output signal can be rendered free of flickering while avoiding signal level (black level) variations.

To achieve the above object, the horizontal transfer register of the solid-state image sensor according to the present invention has a final stage electrode which is independent of the other electrodes of the horizontal transfer register. In order to eliminate flickering, the operation of the horizontal transfer register is stopped for a given period of time, during which field shifting is effected. The final stage electrode is driven by continuous pulses even when the operation of the horizontal transfer register is stopped during field shifting, thereby eliminating the possibility of signal level (black level) variations.

BRIEF DESCRIPTION OF THE DRAWINGS

FIG. 5 shows a circuit configuration of the signal generator which generates the pulses shown in FIGS. 4C–4F.

DETAILED DESCRIPTION OF THE PREFERRED EMBODIMENTS

In the following the preferred embodiments of the present invention will be described with reference to the accompanying drawings.

Assume that an interline-type, two-dimensional CCD image sensor formed of 490 pixels in the vertical direction and 400 pixels in the horizontal direction is applied to an NTSC color TV camera. In such a TV camera, 245 sets of vertical transfer registers are provided for the CCD image sensor, thereby achieving simultaneous readout of signal charges from the 490 photodiodes for each field. This readout is performed such that the signal charges from two photodiodes adjacent in the vertical direction are added to each other.

Figure 1:
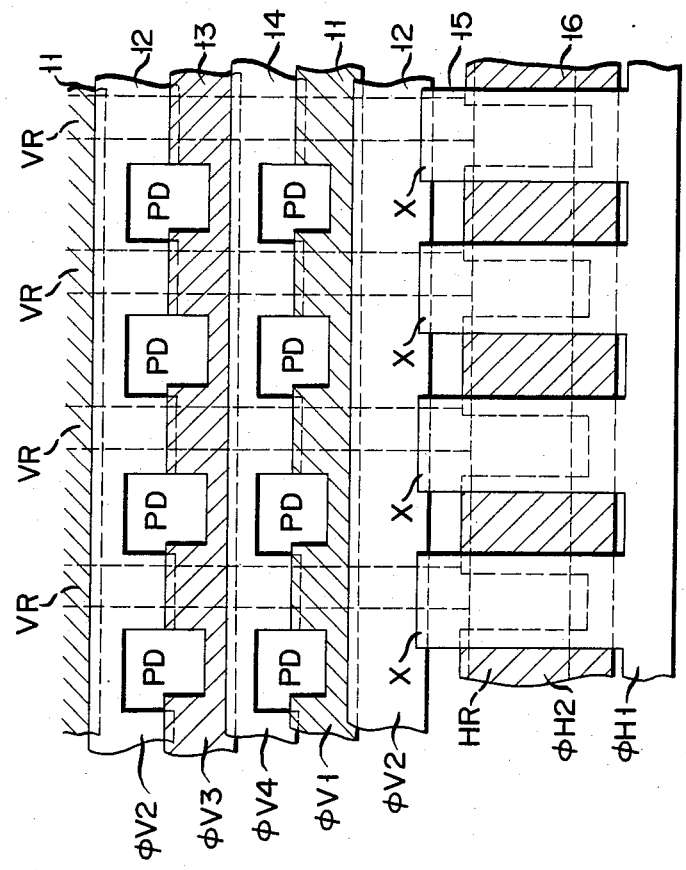
FIG. 1 shows a typical electrode arrangement of a CCD image sensor.

FIG. 1 shows a part of the interline-transfer-type, two-dimensional CCD image sensor. This image sensor includes 400 horizontal pixels and 490 vertical pixels. These pixels are made up of photodiodes PD or the like. Photodiodes PD may be obtained by implanting N-type ions into a P-type semiconductor substrate. In this substrate, 245 (=490/2) vertical transfer registers (CCD shift registers) VR are formed as buried channels by implanting N-type ions. Similarly, horizontal transfer register (CCD shift register) HR is formed by N-ion implantation. The P-substrate formed of the above vertical/horizontal registers is covered with an insulation layer ($SiO_2$ layer). Then, polysilicon vertical transfer electrodes 11–14, and polysilicon horizontal transfer electrodes 15 and 16 are formed, via the insulation layer, over vertical and horizontal registers VR and HR.

Vertical transfer electrodes 11–14 receive vertical driving pulses $\phi V1$–$\phi V4$ (FIGS. 3A–3D), respectively. Vertical transfer electrodes 11 and 13 overlap a part of each of photodiodes PD. Such partial overlapping of each of photodiodes PD by electrodes 11 and 13 is required to achieve field shifting.

Figure 3:
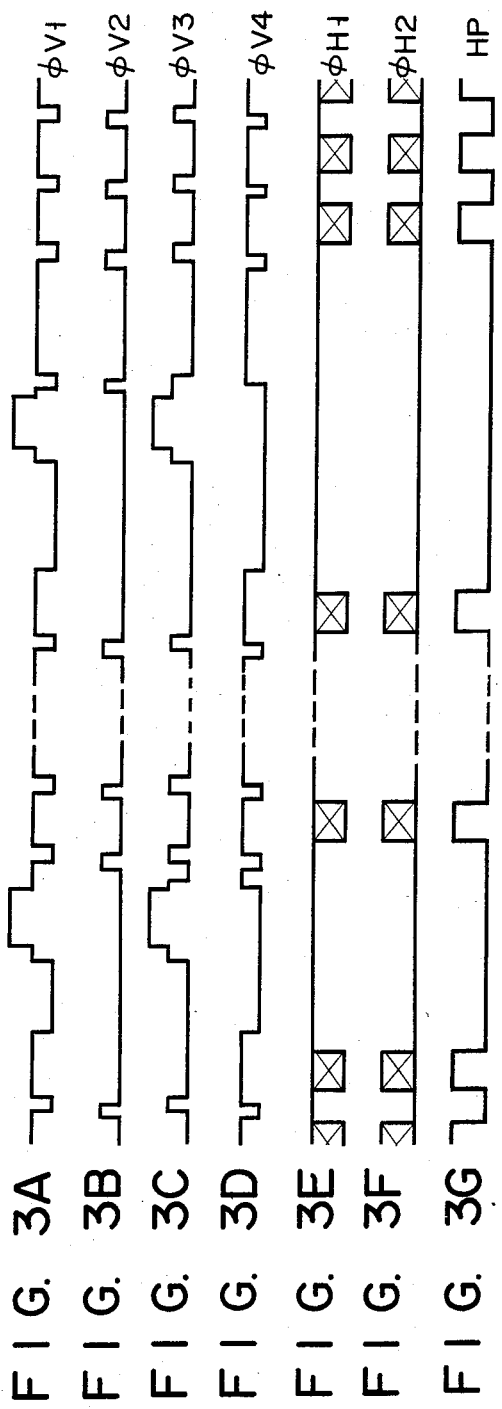
FIGS. 3A–3D show waveforms of vertical driving pulses $\phi V1$–$\phi V4$ used for the CCD image sensor of FIG. 1.
FIGS. 3E–3F show waveforms of horizontal driving pulses $\phi H1$–$\phi H2$ used for the CCD image sensor of FIG. 1.
FIGS. 3G shows horizontal transfer enable pulse HP.

Horizontal transfer electrodes 15 are located in line with the respective ends of vertical transfer registers VR, so that each of the electrodes of vertical transfer registers VR is partly overlapped by its corresponding horizontal transfer electrode 15. Horizontal transfer electrodes 15 are disposed over horizontal transfer electrode 16 and both horizontal transfer electrodes 15 and 16 are arranged over top of horizontal transfer register HR. Electrode 15 receives horizontal transferring pulse $\phi H1$ (FIGS. 3E, 4C), and electrode 16 receives horizontal transferring pulse $\phi H2$ (FIGS. 3F, 4D).

Figure 2:
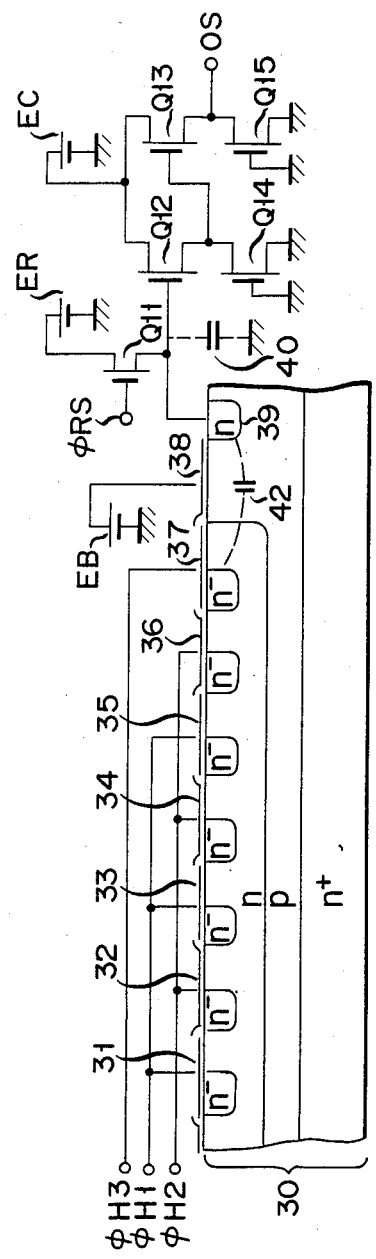
FIG. 2 shows a part of the horizontal transfer register of a CCD image sensor according to an embodiment of the present invention.

FIG. 2 shows a part of the horizontal transfer register of a CCD image sensor according to an embodiment of the present invention. FIGS. 3A–3D show waveforms of vertical driving pulses $\phi V1$–$\phi V4$ used for the CCD image sensor of FIG. 1. FIGS. 3E–3F show waveforms of horizontal driving pulses $\phi H1$–$\phi H2$ used for the CCD image sensor of FIG. 1. FIG. 4A shows an enlarged waveform of horizontal transfer enable pulse HP which is contained in vertical driving pulses $\phi V1$–$\phi V4$. FIG. 4B shows basic clock pulse CK synchronized with horizontal transfer enable pulse HP. FIGS. 4C–4D show enlarged waveforms of horizontal driving pulses $\phi H1$–$\phi H2$ which are used for the embodiment of FIG. 2. FIG. 4E shows an enlarged waveform of horizontal driving pulse $\phi H3$ which is used, together with pulses $\phi H1$–$\phi H2$ of FIGS. 4C–4D, for the embodiment of FIG. 2. FIGS. 4F–4G show enlarged waveforms of reset pulse $\phi RS$ and image sensor output signal OS which are applied to the embodiment of FIG. 2.

In the embodiment of FIG. 2, horizontal transfer electrodes 31–36 are arranged on a horizontal transfer register (CCD shift register; HR in FIG. 1). The horizontal transfer register is formed in semiconductor substrate 30. This horizontal transfer register is driven in a 2-phase mode by pulses $\phi H1$ and $\phi H2$ (FIGS. 4C–4D).

Figure 4:
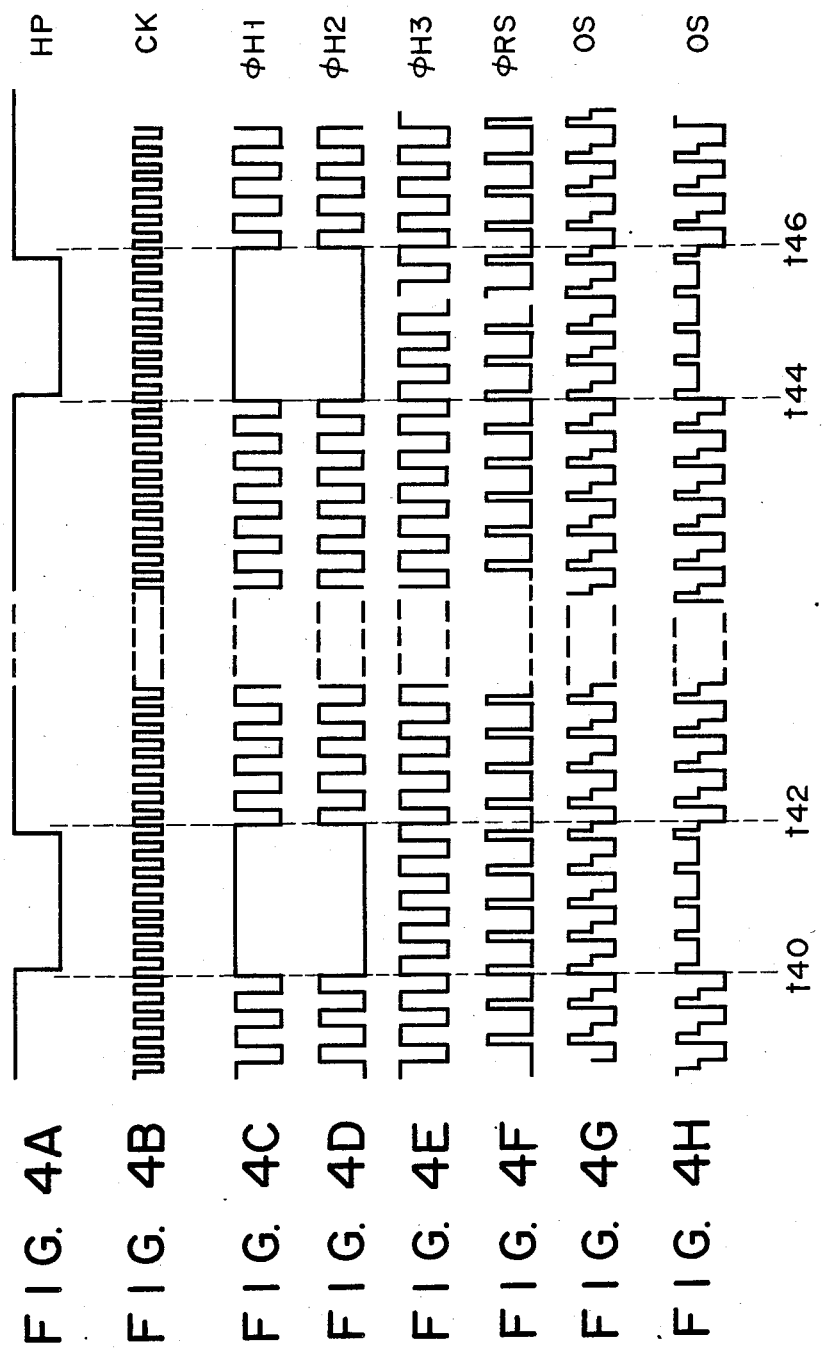
FIG. 4A shows an enlarged waveform of horizontal transfer enable pulse HP which is contained in vertical driving pulses $\phi V1$–$\phi V4$.
FIG. 4B shows basic clock pulse CK synchronized with horizontal transfer enable pulse HP.
FIGS. 4C–4D show enlarged waveforms of horizontal driving pulses $\phi H1$–$\phi H2$ applied to the embodiment of FIG. 2.
FIG. 4E shows an enlarged waveform of horizontal driving pulse $\phi H3$, for final stage electrode 37, which is used, together with the pulses of FIGS. 4C–4D, for the embodiment of FIG. 2.
FIG. 4F shows an enlarged waveform of reset pulse $\phi RS$ which is applied to the embodiment of FIG. 2.
FIG. 4G shows an enlarged waveform of image sensor output OS which is obtained in the embodiment of FIG. 2.
FIG. 4H shows an enlarged waveform of image sensor output OS which is obtained by a conventional image sensor.

The end portion of the horizontal transfer register is provided with final stage electrode 37 which is driven by pulse $\phi H3$ (FIG. 4E). According to the embodiment of FIG. 2, even during the period when pulses $\phi H1$ and $\phi H2$ disappear (t40–t42, t44–t46 in FIGS. 4C–4D), pulse $\phi H3$ (FIG. 4E) is continuously applied to electrode 37. This is the key feature of this invention.

Floating diffusion area 39 is formed in substrate 30 next to the location of final stage electrode 37. Output gate 38, which is biased with given bias potential EB, is located between electrode 37 and diffusion area 39. The n− region under electrode 37 is coupled to the n region of diffusion area 39 via parasitic capacitance 42 which is formed therebetween.

Diffusion area 39 is coupled via MOS transistor Q11 to a reset potential (ER). The gate of Q11 receives reset pulse $\phi RS$ (FIG. 4F). When pulse $\phi RS$ is applied to the gate of Q11, the drain-source path of Q11 is rendered conductive, so that capacitance 40 of diffusion area 39 is charged with potential ER. Thus, diffusion capacitance 40 is reset by pulse $\phi RS$.

Diffusion area 39 is also coupled to the gate of MOS transistor Q12. The drain of Q12 is connected to power supply EC. The source of Q12 is circuit-grounded via the drain-source path of MOS transistor Q14, whose gate is circuit-grounded. The source of Q12 is also connected to the gate of MOS transistor Q13. The drain of Q13 is connected to power supply EC. The source of Q13 is circuit-grounded via the drain-source path of MOS transistor Q15, whose gate is circuit-grounded. Image sensor output OS (FIG. 4G) is delivered from the source of Q13. Transistors Q12–Q15 constitute a sourcefollower circuit which serves as an impedance converter for diffusion capacitance 40.

When field shifting and line shifting are performed, even though no pulses are applied to electrodes 31–36 (t40–t42, t44–t46 in FIGS. 4C–4D), pulse $\phi H3$, having a waveform identical or similar to the waveform of pulse $\phi H1$, is applied to final stage electrode 37 (t40–t42, t44–t46 in FIG. 4E). The potential of $\phi H3$ is divided by the series circuit of parasitic capacitance 42 and floating diffusion capacitance 40, so that a certain part of the potential of $\phi H3$ is superposed onto image sensor output OS. Then, the waveform of output OS, obtained during the field shifting period, can be rendered substantially equal to that obtained during a period other than the field shifting period (FIG. 4G). Thus, the possibility of signal level (black level) variations of output OS is eliminated in the embodiment of FIG. 2. If, however, electrode 37, with pulse $\phi H3$, is not employed, or, when electrode 37 is driven by pulse $\phi H1$, the waveform of output OS will be as shown in FIG. 4H. Should either of these be the case, signal level (black level) variations of output OS will be caused.

FIG. 5 shows a circuit configuration of the signal generator which generates pulses $\phi H1$–$\phi H3$ and $\phi RS$ shown in FIGS. 4C–4F. D-type flip-flop (D-FF) 100 is clocked by pulse CK (FIG. 4B). FF 100 is cleared by horizontal transfer enable pulse HP (FIG. 4A). Pulse P101 from the $\overline{Q}$ output of FF 100 is fed back to the D input thereof. Pulse P100 from the Q output of FF 100 is converted via inverting buffer 112 to pulse $\phi H1$ (FIG. 4C). Pulse P101 is converted via inverting buffer 114 to pulse $\phi H2$ (FIG. 4D). Pulse P100 is input to NOR gate 102. Gate 102 also receives pulse P104 from the Q output of D-FF 104. Pulse P104 is converted via inverting buffer 116 to pulse $\phi H3$ (FIG. 4E).

NORed output pulse P102 from gate 102 is supplied to the D input of FF 104. FF 104 is clocked by pulse CK. PUlse P104 is supplied to the D input of D-FF 106. FF 106 is clocked by pulse P108 which is obtained by inverting the phase of pulse CK via inverter 108. Pulse P106 from the Q output of FF 106 is input to NAND gate 110. Gate 110 also receives pulse P105 from the $\overline{Q}$ output of FF 104. NANDed output pulse P110 from gate 110 is converted via inverting buffer 118 to pulse φRS (FIG. 4F).

The above description clearly shows that, according to the present invention, the degree of potential leakage from final stage electrode 37 to floating diffusion area 39 through parasitic capacitance 42, can be substantially stabilized at any time. Consequently, the possibility for black level variations of image sensor output OS can be eliminated. Elimination of this possibility and realization of the concommitant advantages ensuring therefrom are, moreover, made possible through a compact configuration. The presence of only a simple electrode (37), driven by a continuous pulse (φH3), embodies the objectives and effects of the present invention.

The present invention need not be limited to the embodiment illustrated and described herein. This invention may be embodied in various ways without departing from the scope of the invention as claimed. For instance, the present invention may be applied to a conventional CCD image sensor such as that described by Kenji HORII et al., "A New Configuration of CCD Imager with a Very Low Smear Level-FIT- CCD Imager", *IEEE TRANSACTIONS ON ELECTRON DEVICES, ED*-31, NO.7, (July 1984), pp. 904–906, or such as model "CCD211" Image Sensor, manufactured by Fairchild Camera and Instrument Co., USA, or model "SID52501" Silicon Image Device, manufactured by RCA Co., USA.

The present invention can be applied not only to an interline-transmission-type, two-dimensional, CCD image sensor having photo-gates and/or shift-gates, but also to a frame-transmission-type, two-dimensional, CCD image sensor. Of course, an image sensor whose photosensitive element is formed of MOS diodes may be adapted to meet the objectives of this invention. Further, the present invention may be applied to an X-Y address-type, two-dimensional, MOS image sensor.

What is claimed is:

1. A solid-state image sensor comrising:
   an optical area formed of photosensitive elements which provide signal charges representing an image detected by said optical area, and
   register means for transferring the signal charges from said photosensitive elements to an output region of said image sensor in accordance with given pulses, said register means including:
   horizontal register means for providing an image sensor output representing the image detected by said optical area, said horizontal register means having horizontal transfer electrodes and a final stage electrode independent of said horizontal transfer electrodes, said final stage electrode being arranged between said horizontal transfer electrodes and said output region from which said image sensor outut is obtained;
   first circuit means for supplying said horizontal transfer electrodes with a first signal of horizontal driving pulses so that signal charge transferring is performed, said first signal of horizontal driving pulses having a prescribed blank period during which no horizontal driving pulses are present; and
   second circuit means for supplying said final stage electrode with a final stage driving pulse signal which includes horizontal driving pulses generated when said horizontal driving pulses appear in said first signal and during said prescribed blank period of said first signal.

2. An image sensor according to claim 1, wherein said horizontal register means includes an output gate electrode which is biased with a given bias potential, said output gate electrode being arranged between said final stage electrode and said output region.

3. An image sensor according to claim 1, wherein said horizontal transfer electrodes are provided for first conductivity type regions arranged in a first conductivity type well which is formed in a second conductivity type semiconductor substrate.
   said output region is another first conductivity type region arranged in said second conductivity type semiconductor substrate, and
   said final stage electrode is provided for still another first conductivity type region arranged in said first conductivity type well between the location of said output region and that of one of said horizontal transfer electrodes, said one of said horizontal transfer electrodes being close to the location of said output region.

4. An image sensor according to claim 2, wherein said horizontal transfer electrodes are provided for first conductivity type regions arranged in a first conductivity type well which is formed in a second conductivity type semiconductor substrate,
   said output region is another first conductivity type region arranged in said second conductivity type semiconductor substrate, and
   said first stage electrode is provided for still another first conductivity type region arranged in said first conductivity type well between the location of said output region and that one of said horizontal transfer electrodes, said one of said horizontal transfer electrodes being close to the location of said output region.

5. An image sensor according to claim 3, wherein a capacitance is formed between said first conductivity type output region and said second conductivity type semiconductor subsrate, the potential appearing across said capacitance corresponding to said signal charges, and
   said output region is associated with means for precharging said capacitance with a given potential, in synchronization with said final stage driving pulse, 6. An image sensor according to claim 4, wherein a capacitance is formed between said first conductivity type output region and said second conductivity type semiconductor substrate, the potential appearing across said capacitance corresponding to said signal charges, and
   said output region is associated with means for precharging said capacitance with a given potential, in synchronization with said final stage driving pulse.

7. An image sensor according to claim 3, wherein a capacitance is formed between said first conductivity type output region and said second conductivity type semiconductor substrate, the potential appearing across said capacitance corresponding to said signal charges, and
   said output region is associated with means for precharging said capacitance with a given potential, in synchronization with said final stage driving pulse.

8. An image sensor according to claim 4, wherein a capacitance is formed between said first conductivity type output region and said second conductivity type semiconductor substrate, the potential appearing across said capacitance corresponding to said signal charges, and said output region is associated with means for precharging said capacitance with a given potential, in synchronization with said final stage driving pulse.

9. An image sensor according to claim 5, wherein said horizontal register means is associated with buffer means, coupled to said output region and responsive to the potential appearing across said capacitance, for providing said image sensor output with a circuit impedance lower than the circuit impedance at said capacitance.

10. An image sensor according to claim 6, wherein said horizontal register means is associated with buffer means, coupled to said output region and responsive to the potential appearing across said capacitance, for providing said image sensor output with a circuit impedance lower than the circuit impedance at said capacitance.

11. An image sensor according to claim 7, wherein said horizontal register means is associated with buffer means, coupled to said output region and responsive to the potential appearing across said capacitance, for providing said image sensor output with a circut impedance lower than the circuit impedance at said capacitance.

12. An image sensor according to claim 8, wherein said horizontal register means is associated with buffer means, coupled to said output region and responsive to the potential appearing across said capacitance, for providing said image sensor output with a circuit impedance lower than the circuit impedance at said capacitance.

* * * * *